(12) United States Patent
Nelson et al.

(10) Patent No.: US 10,700,039 B2
(45) Date of Patent: Jun. 30, 2020

(54) SILICON DIE WITH INTEGRATED HIGH VOLTAGE DEVICES

(71) Applicant: Intel Corporation, Santa Clara, CA (US)

(72) Inventors: Donald W. Nelson, Beaverton, OR (US); M. Clair Webb, Aloha, OR (US); Patrick Morrow, Portland, OR (US); Kimin Jun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,382

(22) PCT Filed: Jun. 16, 2014

(86) PCT No.: PCT/US2014/042576
§ 371 (c)(1),
(2) Date: Aug. 29, 2016

(87) PCT Pub. No.: WO2015/195083
PCT Pub. Date: Dec. 23, 2015

(65) Prior Publication Data
US 2017/0069597 A1 Mar. 9, 2017

(51) Int. Cl.
*H01L 25/065* (2006.01)
*H01L 23/538* (2006.01)
(Continued)

(52) U.S. Cl.
CPC ...... *H01L 25/0652* (2013.01); *H01L 21/6835* (2013.01); *H01L 23/49827* (2013.01);
(Continued)

(58) Field of Classification Search
CPC .......... H01L 25/0652; H01L 23/49827; H01L 23/5389; H01L 24/19; H01L 25/50;
(Continued)

(56) References Cited

U.S. PATENT DOCUMENTS 6,821,286 B1 11/2004 Chan et al.
9,460,991 B1 * 10/2016 Or-Bach ............. H01L 25/0657
(Continued)

FOREIGN PATENT DOCUMENTS

JP H03-009555 A 1/1991
JP S63-126261 A 5/1998
(Continued)

OTHER PUBLICATIONS

Intel Corporation, "International Preliminary Report on Patentability and Written Opinion", PCT/US2014/042576, (dated Dec. 29, 2016).

(Continued)

*Primary Examiner* — Ahmed N Sefer
(74) *Attorney, Agent, or Firm* — Schwabe, Williamson & Wyatt, P.C.

(57) ABSTRACT

A method including forming a plurality of first devices and a plurality of first interconnects on a substrate; coupling a second device layer including a plurality of second devices to ones of the plurality of first interconnects, and forming a plurality of second interconnects on the second device layer. An apparatus including a first device layer including a plurality of first circuit devices disposed between a plurality of first interconnects and a plurality of second interconnects and a second device layer including a plurality of second devices juxtaposed and coupled to one of the plurality of first interconnects and the plurality of second interconnects, wherein one of the plurality of first devices and the plurality of second devices include devices having a higher voltage range than the other of the plurality of first devices and the plurality of second devices.

13 Claims, 12 Drawing Sheets

(51) Int. Cl.
*H01L 23/00* (2006.01)
*H01L 21/683* (2006.01)
*H01L 23/498* (2006.01)
*H01L 25/00* (2006.01)
*H01L 23/427* (2006.01)

(52) U.S. Cl.
CPC .......... *H01L 23/5389* (2013.01); *H01L 24/19* (2013.01); *H01L 25/0655* (2013.01); *H01L 25/50* (2013.01); *H01L 23/427* (2013.01); *H01L 24/20* (2013.01); *H01L 2221/68359* (2013.01); *H01L 2223/6677* (2013.01); *H01L 2224/04105* (2013.01); *H01L 2224/12105* (2013.01); *H01L 2224/73267* (2013.01); *H01L 2924/13091* (2013.01); *H01L 2924/15311* (2013.01)

(58) Field of Classification Search
CPC ............. H01L 25/0655; H01L 21/6835; H01L 2223/6677; H01L 2224/04105; H01L 2224/12105; H01L 2221/68359
See application file for complete search history.

(56) References Cited

U.S. PATENT DOCUMENTS

| | | | |
|---|---|---|---|
| 2007/0029630 A1 | 2/2007 | Seyyedy et al. | |
| 2008/0054372 A1 | 3/2008 | Zhang et al. | |
| 2008/0283995 A1 | 11/2008 | Bucki et al. | |
| 2009/0121260 A1* | 5/2009 | Bernstein | H01L 21/6835 257/255 |
| 2009/0160012 A1* | 6/2009 | Kim | H01L 27/0688 257/508 |
| 2010/0081232 A1* | 4/2010 | Furman | H01L 21/2007 438/107 |
| 2010/0133695 A1 | 6/2010 | Lee | |
| 2010/0155932 A1* | 6/2010 | Gambino | G06F 17/5068 257/698 |
| 2010/0213607 A1* | 8/2010 | Smeys | H01L 21/4853 257/723 |
| 2010/0314711 A1 | 12/2010 | Farooq et al. | |
| 2011/0084314 A1 | 4/2011 | Or-Bach et al. | |
| 2012/0091587 A1* | 4/2012 | Or-Bach | H01L 21/6835 257/741 |
| 2012/0129301 A1* | 5/2012 | Or-Bach | G11C 8/16 438/129 |
| 2012/0153357 A1 | 6/2012 | Tang et al. | |
| 2014/0117457 A1 | 5/2014 | Gates et al. | |
| 2015/0171044 A1* | 6/2015 | Nickerson | H01L 24/19 361/748 |

FOREIGN PATENT DOCUMENTS

| | | |
|---|---|---|
| JP | 2001-160612 A | 6/2001 |
| JP | 2001-274355 A | 10/2001 |
| JP | 2008-218786 A | 9/2008 |
| JP | 2010-153799 A | 7/2010 |
| TW | 201130113 | 9/2011 |

OTHER PUBLICATIONS

Intel Corporation, "Office Action", TW Application No. 104114585, (dated Apr. 28, 2016).
Intel Corporation et al., Search Report and Written Opinion, International Application No. PCT/US2014/042576 (dated Jan. 29, 2015).
Notice of Allowance for Taiwan Patent Application No. 104114585, dated Sep. 2, 2016, 2 pages.
Partial European Search Report for European Patent Application No. 14895326.8, dated Feb. 20, 2018, 13 pages.
Preliminary Examination Report for Malaysian Application No. PI2016704171, dated Jan. 3, 2017, 2 pages.
Search Report for European Patent Application No. 14895326.8, dated May 25, 2018, 11 pages.
Office Action for Japanese Patent Application No. 2016-567249, dated May 22, 2018, 5 pages.
Office Action for Japanese Application No. 2016-567249, dated Sep. 18, 2018, 6 pages.
Office Action from Japanese Patent Application No. 2016-567249, dated Jan. 15, 2019, 7 pgs.
Office Action from Malaysian Patent Application No. PI2016704171, dated Dec. 13, 2018, 4 pgs.

* cited by examiner

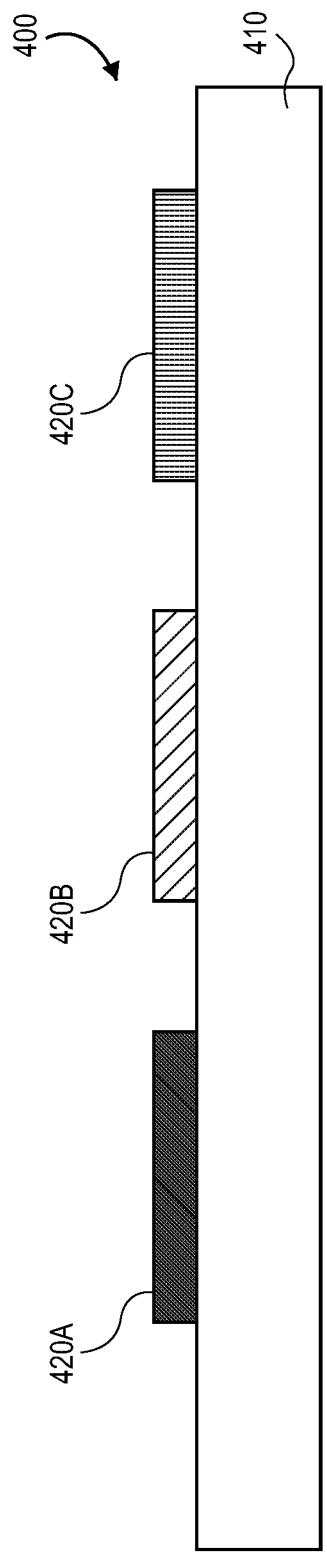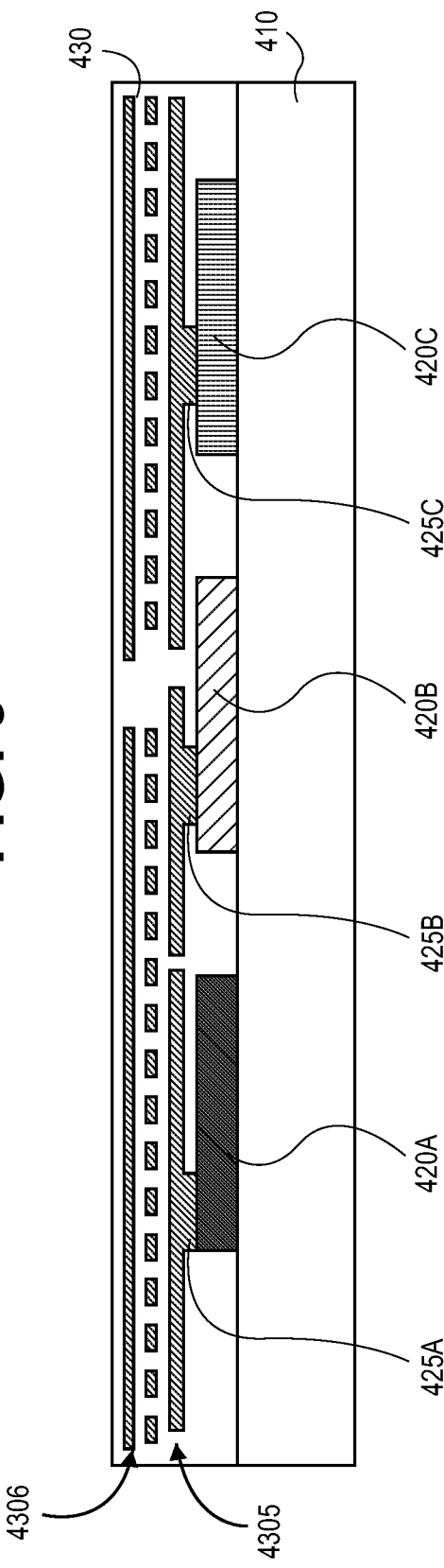

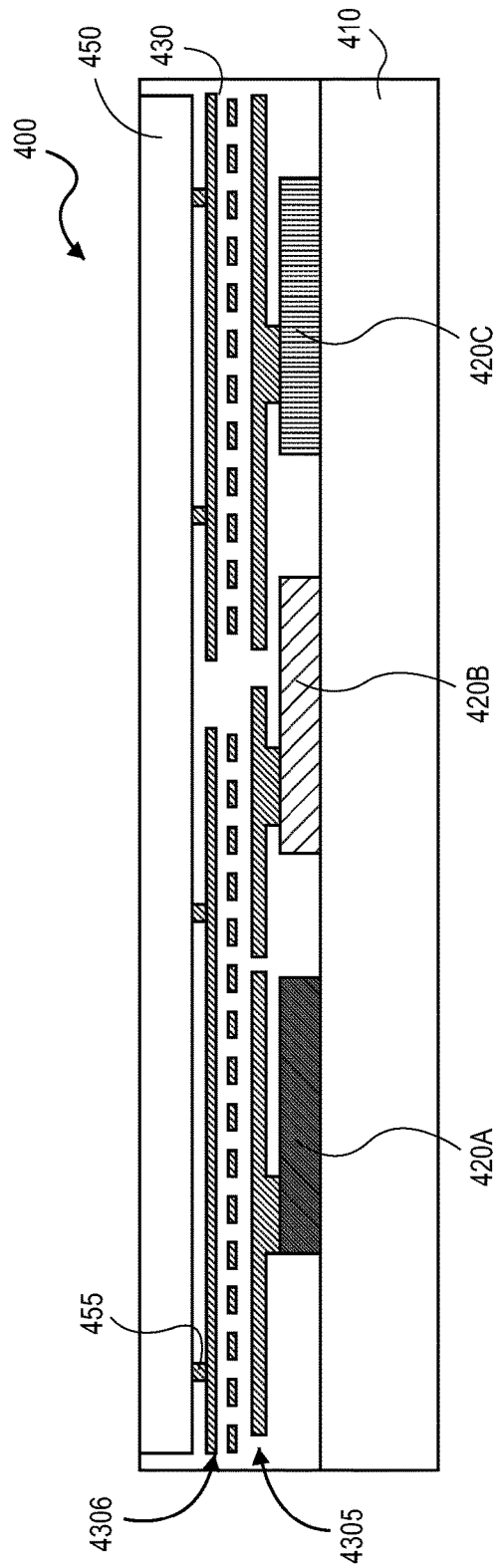
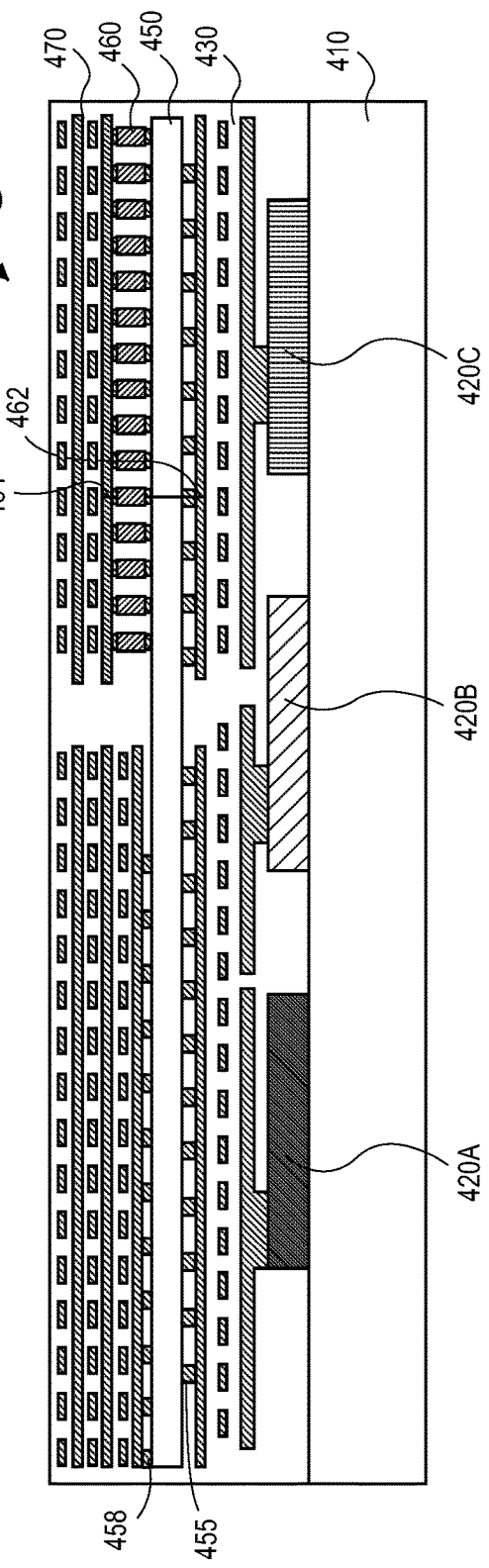
FIG. 5
FIG. 6

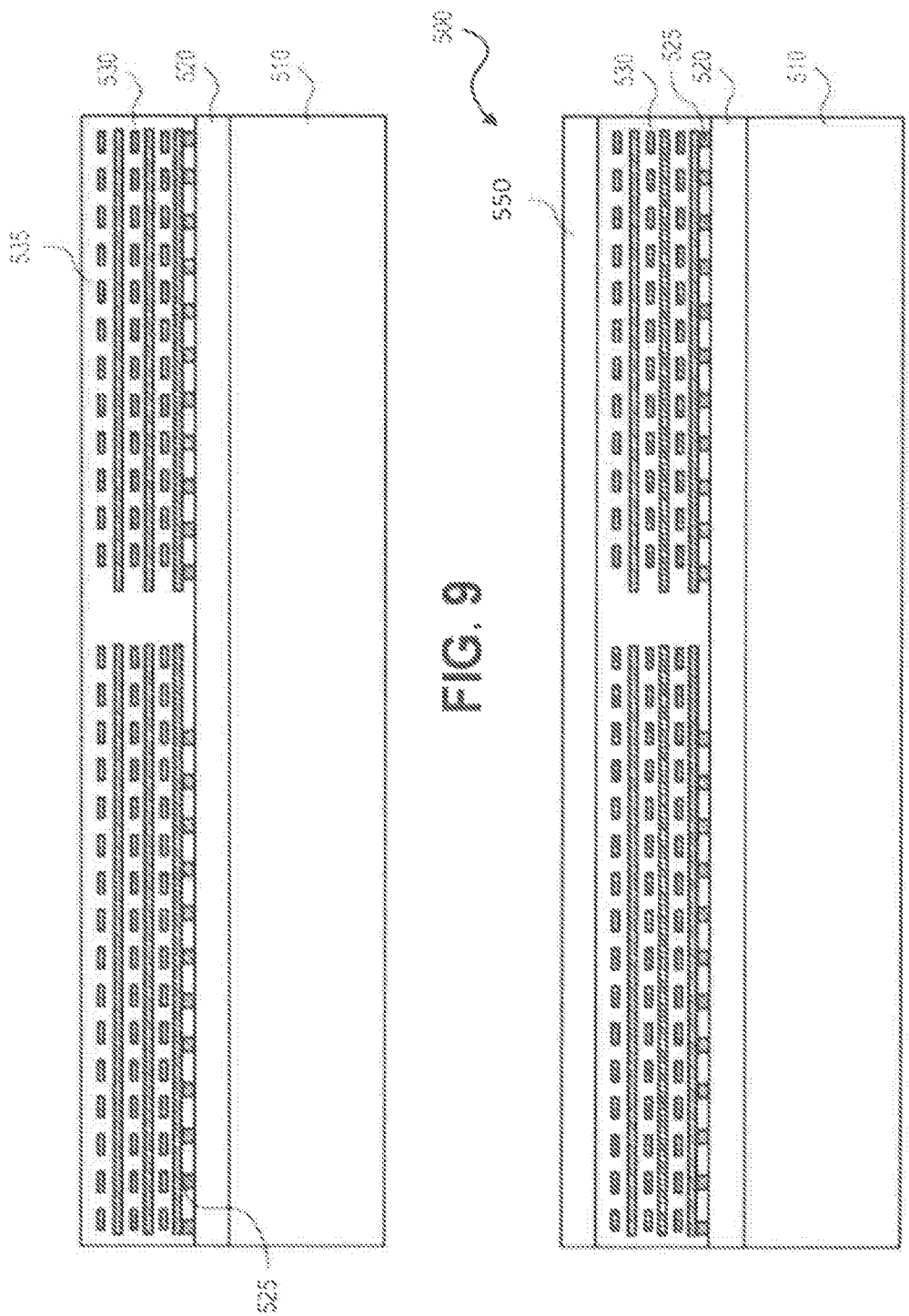

SILICON DIE WITH INTEGRATED HIGH VOLTAGE DEVICES

CROSS-REFERENCE TO RELATED APPLICATION

This patent application is a U.S. National Phase Application under 35 U.S.C. § 371 of International Application No. PCT/US2014/042576, filed Jun. 16, 2014, entitled SILICON DIE WITH INTEGRATED HIGH VOLTAGE DEVICES.

BACKGROUND

Field

Integrated circuits and more particularly, monolithic three-dimensional integrated circuits.

Description of Related Art

Monolithic integrated circuits (ICs) generally include a number of transistors, such as metal oxide semiconductor field effect transistors (MOSFETs) fabricated over a planar substrate, such as a silicon wafer. Lateral scaling of IC dimensions is becoming more difficult with MOSFETs gate dimensions now below 20 nm. As device sizes continue to decrease, there will come a point where it becomes impractical to continue standard planar scaling. This inflection point could be due to economics or physics, such as prohibitively high capacitance, or quantum-based variability. Stacking of devices in a third dimension, typically referred to as vertical scaling, or three-dimensional (3D) integration, is a promising path toward greater transistor density.

BRIEF DESCRIPTION OF THE DRAWINGS

FIG. 3 shows a cross-sectional side view of the substrate having a device layer with a number of relatively high voltage swing devices formed thereon.

FIG. 4 shows the structure of FIG. 3 following the introduction of a plurality of first interconnect layers juxtaposed to the device layer of the substrate.

FIG. 5 shows the structure of FIG. 4 following the introduction of a second device layer onto the structure juxtaposed to the plurality of interconnect layers.

FIG. 6 shows the structure of FIG. 5 following the introduction of a second plurality of interconnects on the structure juxtaposed to the second device layer.

FIG. 9 shows a cross-sectional side view of a portion of semiconductor substrate including a first device layer including integrated circuit devices and after forming a first plurality of interconnects on the substrate ones of which are connected to integrated circuit devices in the first device layer.

FIG. 10 shows the structure of FIG. 9 following the introduction of a second device layer on the structure juxtaposed to the first plurality of interconnects.

DETAILED DESCRIPTION

Figure 1:
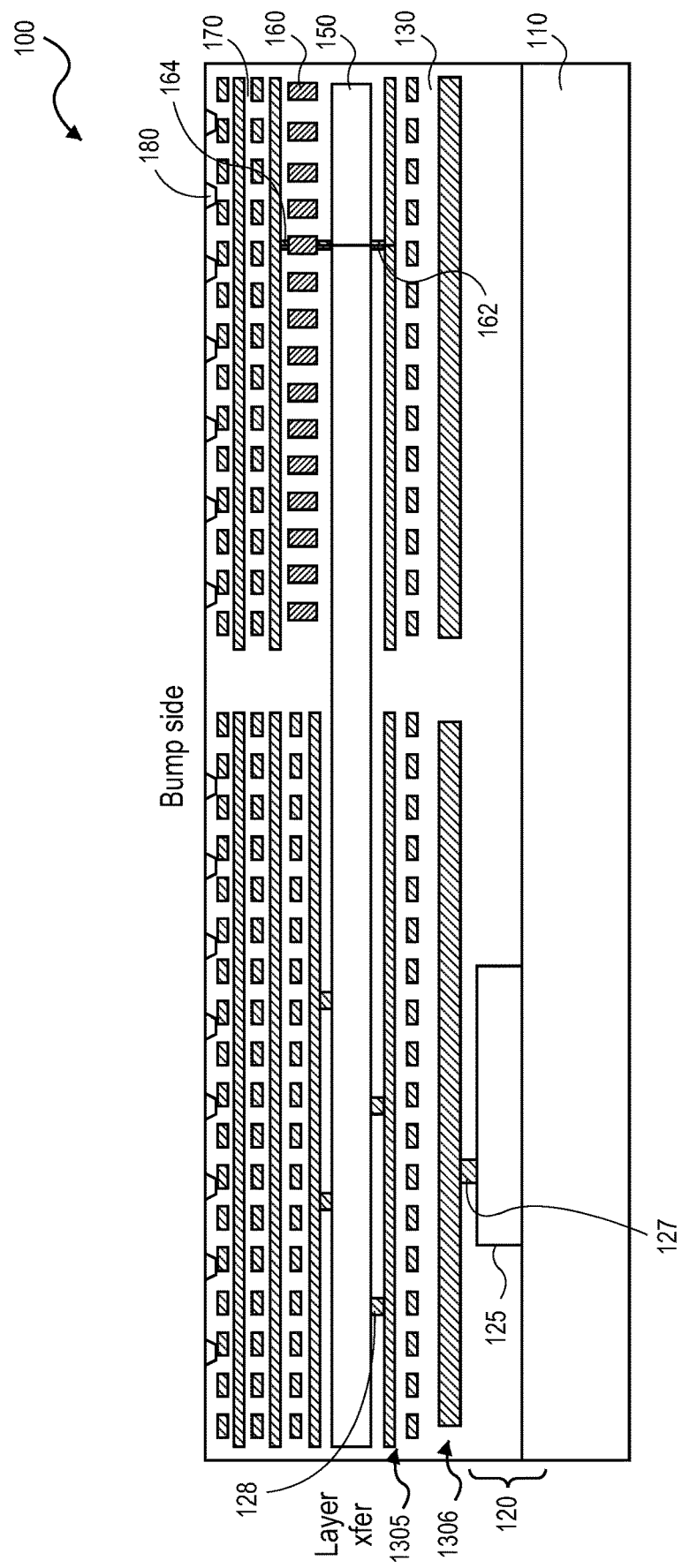
FIG. 1 shows a cross-sectional side view of one embodiment of a monolithic three-dimensional integrated circuit including multiple device layers and multiple interconnect layers.

An integrated circuit (IC) and a method of forming an IC are disclosed. In one embodiment, a monolithic three-dimensional (3D) IC and its method of manufacture and use is described that, in one embodiment, includes device layers including devices having different voltage ranges in respective device layers of a die. By at least partially segregating devices of different voltage ranges in different device layers the monolithic 3D IC offers increased area for a particular device, allowing increased device density and allows fabrication techniques to be tailored at a device layer for the particular device to be formed thereon.

In the following description, various aspects of the illustrative implementations will be described using terms commonly employed by those skilled in the art to convey the substance of their work to others skilled in the art. However, it will be apparent to those skilled in the art that embodiments may be practiced with only some of the described aspects. For purposes of explanation, specific numbers, materials and configurations are set forth in order to provide a thorough understanding of the illustrative implementations. However, it will be apparent to one skilled in the art that the embodiments may be practiced without the specific details. In other instances, well-known features are omitted or simplified in order not to obscure the illustrative implementations.

Various operations will be described as multiple discrete operations, in turn, in a manner that is most helpful in understanding the embodiments described herein, however, the order of description should not be construed to imply that these operations are necessarily order dependent. In particular, these operations need not be performed in the order of presentation.

Implementations may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate such as in device layers as will be noted herein. In various implementations, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations, the gate electrode may consist of a combination of U-shaped structures and planar, non-U-shaped structures. For example, the gate electrode may consist of one or more U-shaped metal layers formed atop one or more planar, non-U-shaped layers.

In some implementations, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Generally, monolithic 3D ICs entail two or more levels of devices (e.g., transistors) in the form of device layer as opposed to dies (device layer plus bulk substrate). The device layers are interconnected on and over a substrate. For example, beginning with a first semiconductor substrate, a first device layer of devices (e.g., transistors) is fabricated according to conventional techniques and a plurality of first interconnects are connected to the devices. A donor substrate either including a second device layer of devices or devoid of devices is then bonded to the first substrate and a portion of the donor substrate is cleaved off to leave the second device layer of a semiconductor thin film juxtaposed to or on the plurality of first interconnects. This method is, of course, only one of many ways to obtain a single crystal substrate for the second layer of devices. Where the second device layer was devoid of devices prior to bonding, a second device layer of devices (e.g., transistors) is then fabricated in the semiconductor thin film and inter level interconnects may be formed between the transistor levels. A plurality of second interconnects are formed on the second device layer with ones of the interconnects connected to devices in the second device layer and contact points operable to connect the monolithic 3D IC to a substrate (e.g., a package substrate) are formed to the plurality of second interconnects.

In the foregoing example, either of the first device layer and the second device layer may include devices having a higher voltage range than devices included in the other of the device layers. Representatively, devices having a higher voltage range include, but are not limited to, devices operable for use with high frequency (e.g., radio frequency (RF)) and power switching applications. Exemplary of such devices are relatively large (e.g., older generation) p-type and/or n-type devices, high electron mobility transistors such as gallium nitride (GaN) or gallium arsenide (GaAs). Representatively, such devices can include devices that can withstand increased voltage and provide increased drive current. Such devices tend to be larger than state of the art logic devices. Lower voltage range typically faster devices include logic devices such as FinFETs or other reduced formfactor device that can be arranged on a device layer at a higher pitch than higher voltage range devices. Representatively, current FinFETs have a voltage range of zero to 1.5 volts. Higher voltage range devices, in one embodiment, are devices with voltage ranges greater than 1.5 volts, such as ranges up to 5.5 volts.

FIG. 1 shows one embodiment of a monolithic 3D IC including multiple device layers and multiple interconnect layers. Referring to FIG. 1, structure 100 includes substrate 110 that is, for example, a single crystal semiconductor substrate (e.g., single crystal silicon) or a semiconductor on insulator structure. Substrate 110 includes device layer 120 that, in this embodiment, includes a number of devices 125. In one embodiment, devices 125 include high voltage range devices, such as devices used for high frequency (e.g., RF) and power switching applications. Examples include, but are not limited to, a gallium nitride (GaN) or large (e.g., older generation) p-type and/or n-type transistor devices.

Juxtaposed to or on device layer 120 is a plurality of interconnects 130 that are connected to devices 125 of device layer 120. Where devices 125 and device layer 120 include devices having a relatively higher voltage range than current logic devices, such plurality of interconnects 130 have dimensions selected to accomodate, for example, the impedance of an electrical load (e.g., impedance matching). FIG. 1 illustrates interconnect 1306 having dimensions operable to accomodate devices having a higher voltage range (large or thick interconnect). Representatively, in one embodiment, interconnects 1305 have a thickness on the order of at least 0.67 times a gate pitch and interconnects 1306 have a thickness more than 100 to 1000 times the thickness of interconnects 1305. FIG. 1 shows conductive contact 127 between device 125 and interconnect 1306. Plurality of interconnects 130 also include one or more interconnects 1305 operable to accomodate higher speed devices (e.g., small or thin interconnects). Plurality of interconnect 130 are formed of a conductive material such as copper and are insulated from one another by an interlayer dielectric material (e.g., an oxide). Overlying an ultimate interconnect of plurality of interconnects 130 (as viewed) is also a dielectric material.

FIG. 1 shows device layer 150 juxtaposed to or on plurality of interconnects 130. In one embodiment, device layer 150 is a single crystal semiconductor (e.g., silicon) layer that has been transferred to its position in structure 100 from another substrate by way of a layer transfer process. Device layer 150, in one embodiment, includes a number of devices, such as a number array or arrays of logic and/or high speed devices such as logic devices. In one embodiment, such devices may include multi-gate field effect transistors (FETs) such as FinFETs. Such devices are arranged, in one embodiment, at a finer pitch than an arrangement of higher voltage range devices in device layer 120. In one embodiment, ones of devices in device layer 150 are connected to ones of plurality of interconnects 130. Overlying device layer 150, as shown in FIG. 1, is plurality of interconnects 170. Plurality of interconnects 170 are connected to devices in device layer 150 and have dimensions selected, in one aspect, for compatibility (e.g., impedance matching) with such devices. FIG. 1 also shows memory elements 160 embedded in plurality of interconnects 170. Memory elements 160 include, for example, scalable two transistor memory (STTM) or resistive random access memory (ReRAM) devices that, in one embodiment, are connected to devices in device layer 150. FIG. 1 shows connection 162 (a conductive contact) between one of memory elements 160 and one of an interconnect in plurality of interconnects 130 and connection 164 between the memory element and one of plurality of interconnects 170. In one embodiment, devices, such as transistors in device layer 150, are operable to enable individual memory bits during write and read operations.

Juxtaposed to or on plurality of interconnects 170 are exposed contact points 180 that provide contact ponts for power, ground, $V_{CC}$ and $V_{SS}$ connectivity to structure 100. Such contact points may be used to connect structure 100 to a substrate, such as a package substrate. Contacts 180 are connected to a metallization layer including a routing layer according to conventional techniques where such metallization layer is insulated from the ultimate interconnect and an exposed surface of the structure.

Figure 2A:
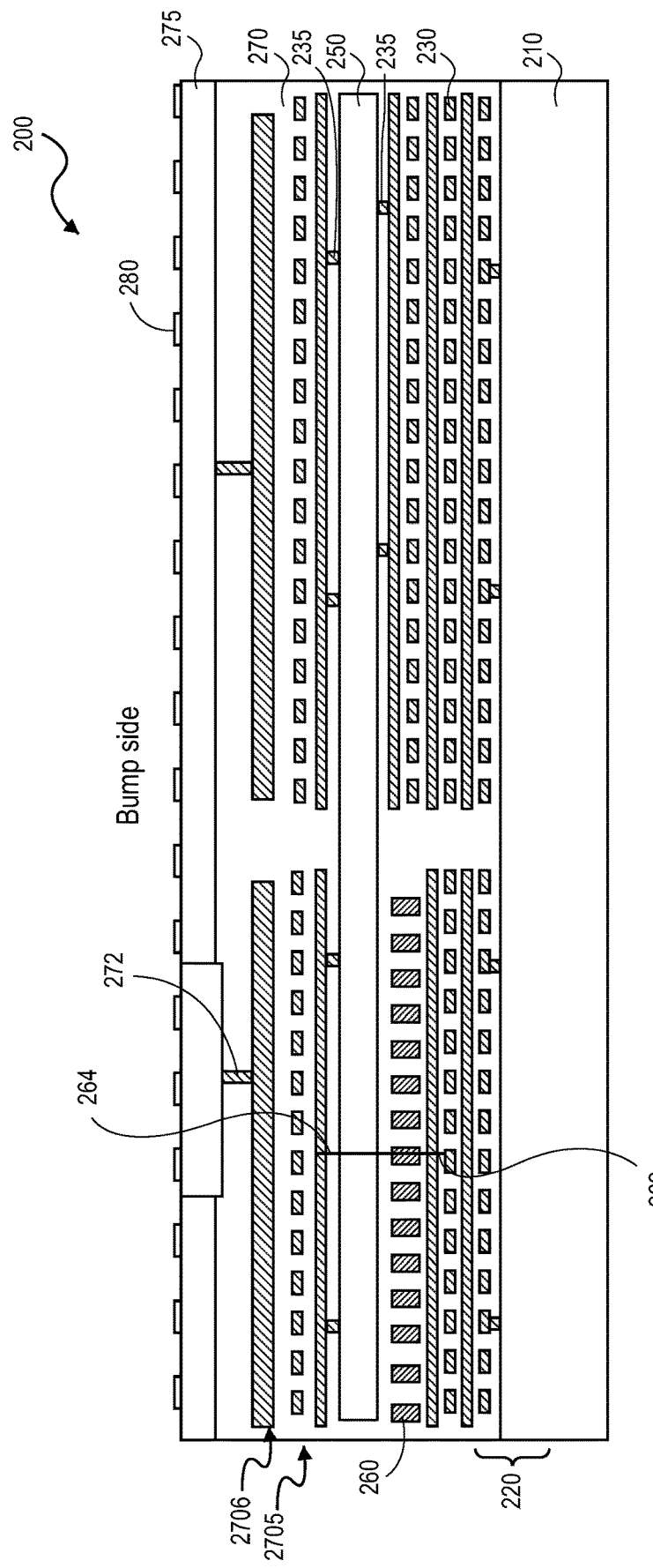
FIG. 2A shows a cross-sectional side view of another embodiment of a monolithic three-dimensional integrated circuit structure.

FIG. 2A shows another embodiment of a monolithic 3D IC structure. Referring to FIG. 2A, structure 200 includes substrate 210 of, for example, a single crystal semicondutor (e.g., silicon) or a semiconductor on insulated structure. In one embodiment, substrate 210 includes device layer 220 including an array or arrays of high speed logic devices. Juxtaposed to or on substrate 210 in FIG. 2A is plurality of interconnects 230 of, for example, copper interconnects representatively matched to an impedance of any devices on substrate 210. Disposed or embedded in plurality of interconnects 230 are memory elements 260 of, for example, STTM or ReRAM. Juxtaposed to or on plurality of interconnects 230, in the embodiment shown in FIG. 2A, structure 200 includes device layer 250. In one embodiment, device layer 250 includes an array or arrays of high speed devices such as high speed logic devices disposed or arranged at a relatively finer pitch than larger devices. Device layer 250 may be introduced by a layer transfer process from another substrate. Ones of devices in device layer 250 are connected to ones of plurality of interconnects 230 through conductive contacts, such as contact 235.

Juxtaposed to or on device layer 250 of structure 200 in FIG. 2A is plurality of interconnects 270. Plurality of interconnects 270 include interconnects having dimensions that are impedance matched to devices in device layer 250. Plurality of interconnects 270 may also include interconnects having dimensions to accomodate higher swing voltage devices or larger (e.g., older generations) PMOS and/or NMOS devices. FIG. 2A shows interconnects 2705 with dimensions selected for matching to high speed devices in silicon device layer 250 and conductive contacts 255 between devices in device layer 250 and interconnects 2705.

FIG. 2A also shows interconnect 2706 of plurality of interconnects 270 having dimensions matched for higher or larger voltage swing devices.

Juxtaposed to or on plurality of interconnects 270 is device layer 275. In one embodiment, device layer 275 includes higher voltage swing devices such as gallium nitride devices or larger (e.g., older generation) PMOS and/or NMOS devices. Such devices are connected, in one embodiment, to ones of plurality of interconnects 270 through conductive contacts 272, notably to interconnect 2706 that has dimensions selected for impedance matching of devices in device layer 275. Device layer 275, in one embodiment, is introduced to structure 200 through a layer transfer process from, for example, another substrate. FIG. 2A also shows contact points 280 formed on a surface of device layer 275 opposite that juxtaposed to or on interconnects 270. Contact points 280, in one embodiment, are used to connect structure 200 to a substrate, such as a package substrate.

With respect to memory element 260 and structure 200 of FIG. 2A, FIG. 2A shows memory element 260 embedded in plurality of interconnects 230. One side of a memory device may be connected to an interconnect of plurality of interconnets 230 (through conductive contact connection point 262) and another side of a memory device connected to an interconnect of plurality of interconnects 270 (through conductive contact connection point 264). Devices (e.g., transistors) in device layer 250 are connected to ones of the memory elements through conductive contacts and are operable to enable memory elements during write and read operation.

Figure 2B:
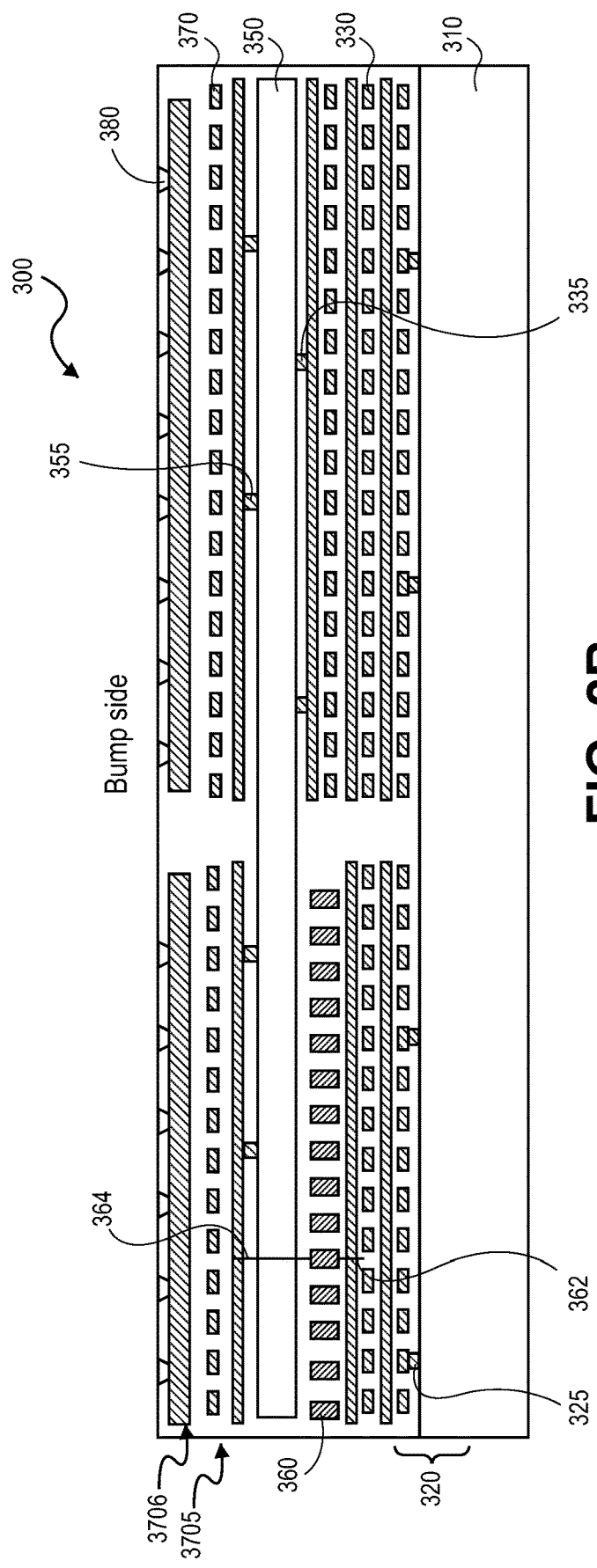
FIG. 2B shows a cross-sectional side view of another embodiment of a monolithic three-dimensional integrated circuit structure.

FIG. 2B shows another embodiment of a monolithic 3D IC structure. Referring to FIG. 2B, structure 300 includes substrate 310 of, for example, a single crystal semiconductor material such as silicon or a semiconductor on insulator structure. In this embodiment, substrate 310 optionally includes device layer 320 including high performance, high speed devices such as high speed logic devices. Juxtaposed to or on substrate 310 is plurality of interconnects 330 having dimensions to accomodate impedance match devices in device layer 320. FIG. 2B shows conductive contacts 325 between ones of plurality of interconnects 330 and devices in device layer 320. Embedded within plurality of interconnects 330 is optionally memory elements 360 of, for example, STTM and/or RERAM memory elements.

Juxtaposed to plurality of interconnects 330 of structure 300 in FIG. 2B is device layer 350. In one embodiment, device layer 350 includes high speed devices such as high speed logic devices. Such devices in device layer 350 are connected to ones of plurality of interconnects 330 through conductive contacts 335.

Juxtaposed to or on device layer 350 is plurality of interconnects 370 including interconnects 3705 having dimensions that are operable to be impedance matched to devices in device layer 350. FIG. 2A shows conductive contacts 355 between ones of interconnects 3705 and device layer 350. Plurality of interconnects 370 also includes interconnects 3706 that have dimensions that are operable to be impedance match to high voltage swing devices. FIG. 2B shows contact points 380 formed to interconnects 3706 and exposed on a side of structure 300. Contact points 380 may be used to connect structure 300 to another structure such as a package substrate.

FIGS. 3-8 describe one method of forming a monolithic 3D IC. Referring to FIG. 3, in one embodiment, high voltage swing devices and/or larger (e.g., older generation) PMOS and/or NMOS devices are formed on a substrate. FIG. 3 shows substrate 410 of, for example, a single crystal semiconductor substrate (e.g., a silicon substrate). Disposed on substrate 410 is a device layer including devices 420A, 420B and 420C. Device 420A is, for example, a GaN device; device 420B is, for example, an older generation n-type device; and device 420C is representatively an older generation p-type device. Such devices may be used in high power applications.

FIG. 4 shows the structure of FIG. 3 following the introduction of a plurality of interconnects juxtaposed to substrate 410, where ones of the plurality of interconnects are connected to the devices. FIG. 4 shows plurality of interconnects 430 including interconnects 4305 having dimensions that are compatible (e.g., impedance matched) for relatively high voltage swing devices such as devices 420A, 420B and 420C. Plurality of interconnects 430 also includes interconnects 4306 that, in one embodiment, have dimensions different than the dimension of interconnects 4305. In one embodiment, plurality of interconnects 430 are a copper material and patterned as is known in the art. Device layer contacts 425A, 425B and 425C between the devices and a first level interconnect may be tungsten or copper and interlevel contacts between interconnects are, for example, copper. The interconnects are insulated from one another and from the devices by dielectric material (e.g., an oxide).

FIG. 5 shows the structure of FIG. 4 following the introduction of a device layer onto the structure. FIG. 5 shows device layer 450 juxtaposed to or on plurality of interconnects 430. In one embodiment, device layer 450 is a single crystal semiconductor layer (e.g., silicon layer) includes a layer that is introduced through a layer transfer process. Device layer 450 may or may not include devices at the time of transfer. In an embodiment where such layer does not include devices at the time of transfer, a plurality of devices may be formed post-transfer. Such devices include high speed devices such as high speed logic devices (e.g., finFET devices). Such devices may also be layed out or arranged at a finer pitch in device layer 450 than high voltage swing devices and/or larger (older generation) devices associated with the other device layer on structure 400 (e.g., device layer including devices 420A-420C). Such devices, in one embodiment, are connected to interconnects 4306 of plurality of interconnects 430 through, for example, contacts 455 between the device layer and the interconnect.

FIG. 6 shows the structure of FIG. 5 following the introduction of a plurality of interconnects on the structure. FIG. 6 shows the plurality of interconnects 470 juxtaposed to or on device layer 450 where ones of the plurality of interconnects 470 are connected to devices in device layer 450. As illustrated in FIG. 6, devices in device layer 450 may be connected to ones of plurality of interconnects 470 through contacts 458 and/or to ones of plurality of interconnects 430 through contacts 455. FIG. 6 also shows memory elements 460 embedded in plurality of interconnects 470. In one embodiment, memory elements 460 (e.g., STTM and/or ReRAM elements) are connected at one end to plurality of interconnects 470 (through contact 464) and to device layer 450 and to plurality of interconnects 430 through contacts 462. Devices in device layer 450 are operable to enable a memory element during memory read and write operation.

FIG. 6 shows plurality of interconnects 470 isolated from one another and from the device layer by dielectric material as is known in the art. Plurality of interconnects 470 are selected, in one embodiment, from a material such as a copper introduced by a plating process with contacts 458 to devices in device layer 450 representatively being copper or tungsten and contacts between interconnects being copper.

Figure 7:
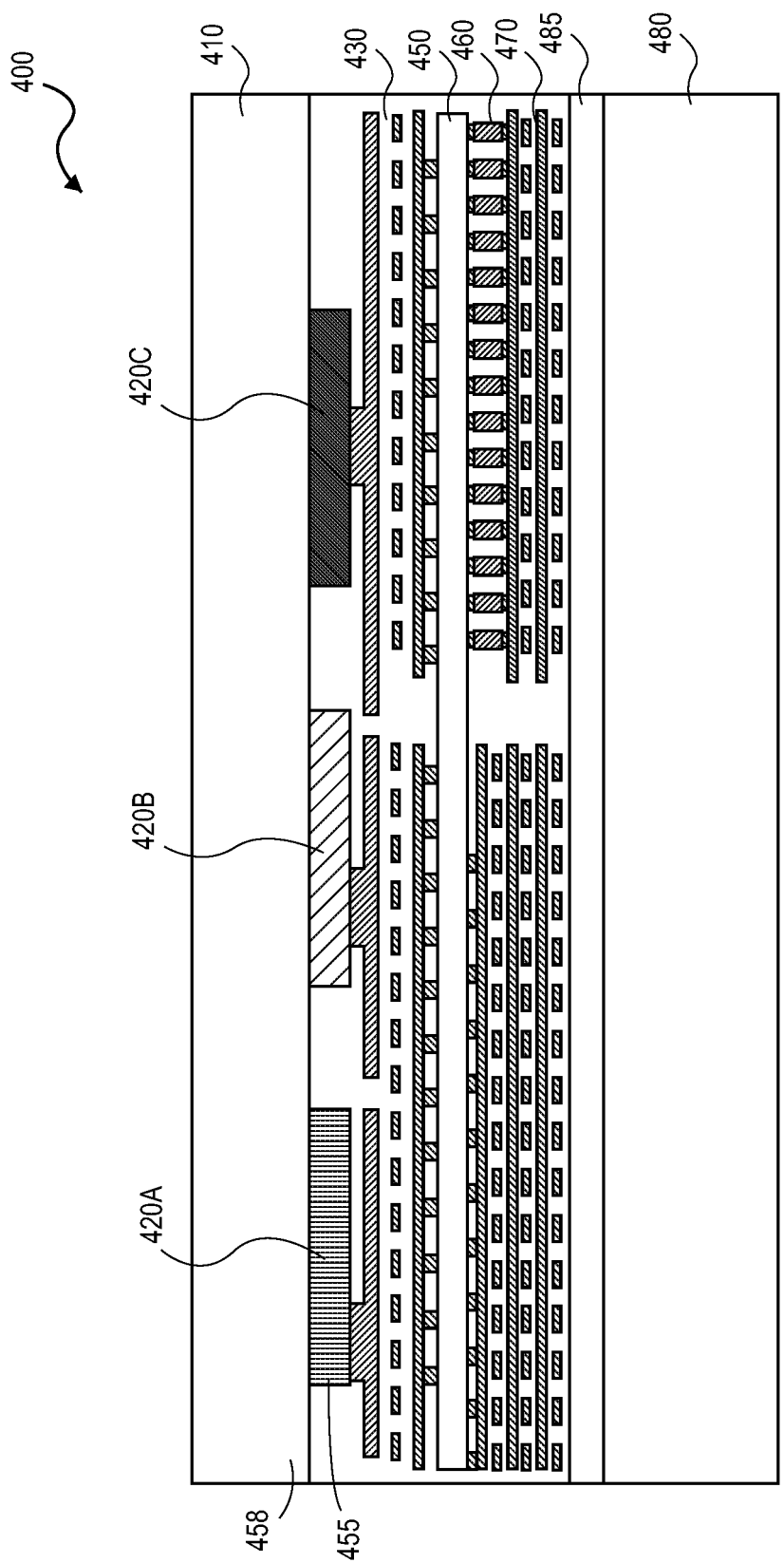
FIG. 7 shows the structure of FIG. 6 following the connection of the structure to a carrier wafer.

FIG. 7 shows the structure of FIG. 6 following the connection of the structure to a carrier wafer. In one embodiment, structure 400 from FIG. 7 is inverted and bonded to a carrier wafer. FIG. 7 shows carrier wafer 480 of, for example, a silicon or ceramic or other suitable substrate. Overlying a surface of carrier wafer 480, in one embodiment, is dielectric material layer 485 (e.g., an oxide layer). FIG. 7 shows plurality of interconnects 470 juxtaposed to carrier wafer 480.

Figure 8:
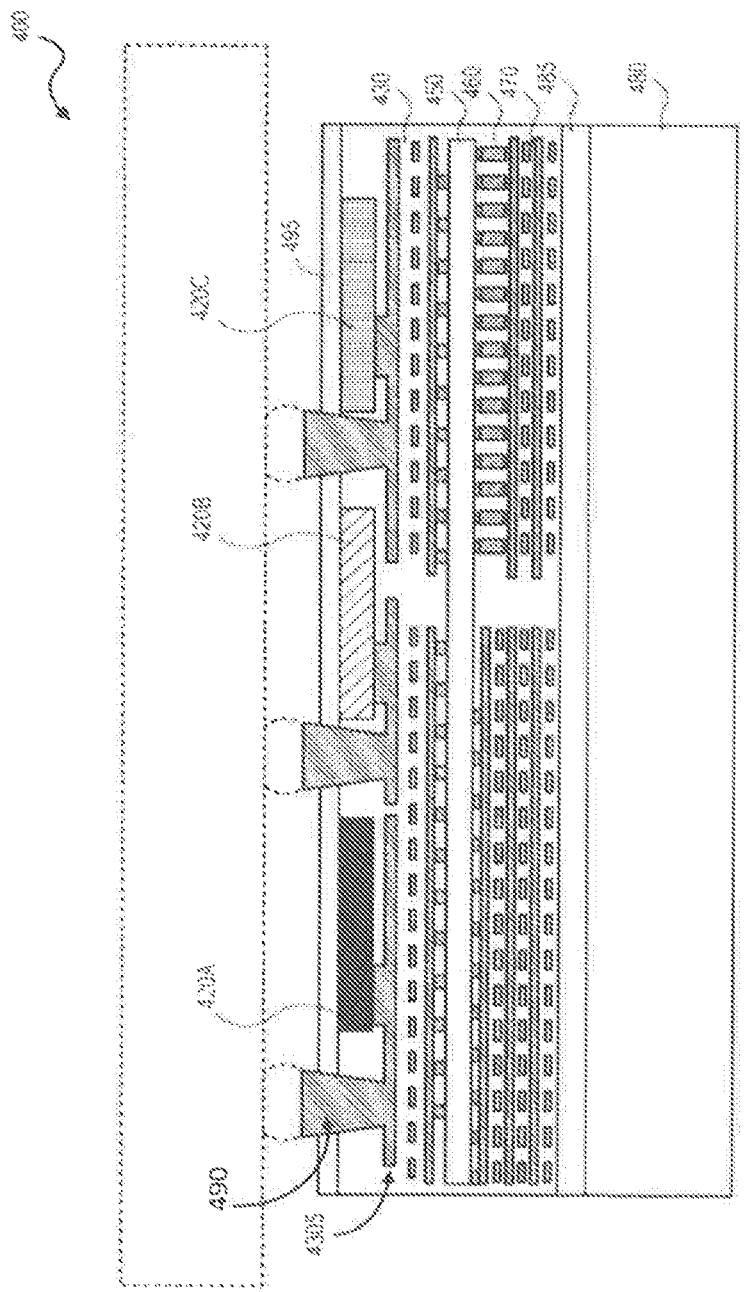
FIG. 8 shows the structure of FIG. 7 following the removal of the substrate from the structure and following the forming of contact points on a side of the structure and connected to first plurality of interconnects.

FIG. 8 shows the structure of FIG. 7 following the removal of substrate 410 from the structure. In one embodiment, substrate 410 is removed by mechanical (e.g., grinding) or other mechanism (e.g., etch). Substrate 410 is removed to the extent that at least a device layer including, in this embodiment, devices 420A, 420B and 420C remain on the carrier wafer. FIG. 8 also shows the structure following the introduction of contact points 490 to plurality of interconnect 430 (notably to interconnect 4305). FIG. 8 also shows the structure following the passivation of the surface of the device layer with passivation layer 495 of, for example, an oxide. Contact points 490 may be used to connect structure 400 to a substrate, such as a package substrate. Once formed, the structure, if formed at a wafer level, may be singulated into a discreet monolithic 3D IC. FIG. 8 representatively shows structure 400 after singulation and illustrates in ghost lines the connection of the structure to a package substrate through solder connections to contact points 490.

FIGS. 9-12 shows a second embodiment of a method of forming a monolithic 3D IC. Referring to FIG. 9, in one embodiment, high speed devices such as high speed logic devices (e.g., FinFETs) are formed on a substrate. FIG. 9 shows substrate 510 of, for example, a single crystal semiconductor material such as single crystal silicon. Disposed on substrate 510 is device layer 520 including an array or arrays of relatively high speed devices. Juxtaposed to or on device layer 520 in FIG. 9 is plurality of interconnects 530 selected, in one embodiment, to have dimensions that are compatible (e.g., impedance matched) to the fine pitch high speed devices in device layer 520. Such plurality of interconnects 530 may be formed by processes as known in the art. FIG. 9 also shows device level contacts 525 between devices in device layer 520 and ones of plurality of interconnects 530. Such device level contacts 525 may representatively be a tungsten material or a copper material. Contacts between interconnects are representatively a copper material. Plurality of interconnects 530 are separated from one another by interlayer dielectric material such as an oxide. FIG. 9 also shows layer 535 of dielectric material overlying the ultimate one of plurality of interconnects 530 (as viewed).

FIG. 10 shows the structure of FIG. 9 following the transfer of a device layer to the structure. Representatively, a sacrificial substrate including a region designated as a device layer may be bonded to structure 500 so that the designated device layer is juxtaposed to plurality of interconnects 530 (on layer 535). Once the sacrificial substrate including the device layer is bonded to structure 500, the sacrificial substrate may be removed, such as by mechanical means (e.g., grinding) or other mechanism (e.g., etching). FIG. 10 shows device layer 550 juxtaposed to plurality of interconnects 530.

Figure 11:
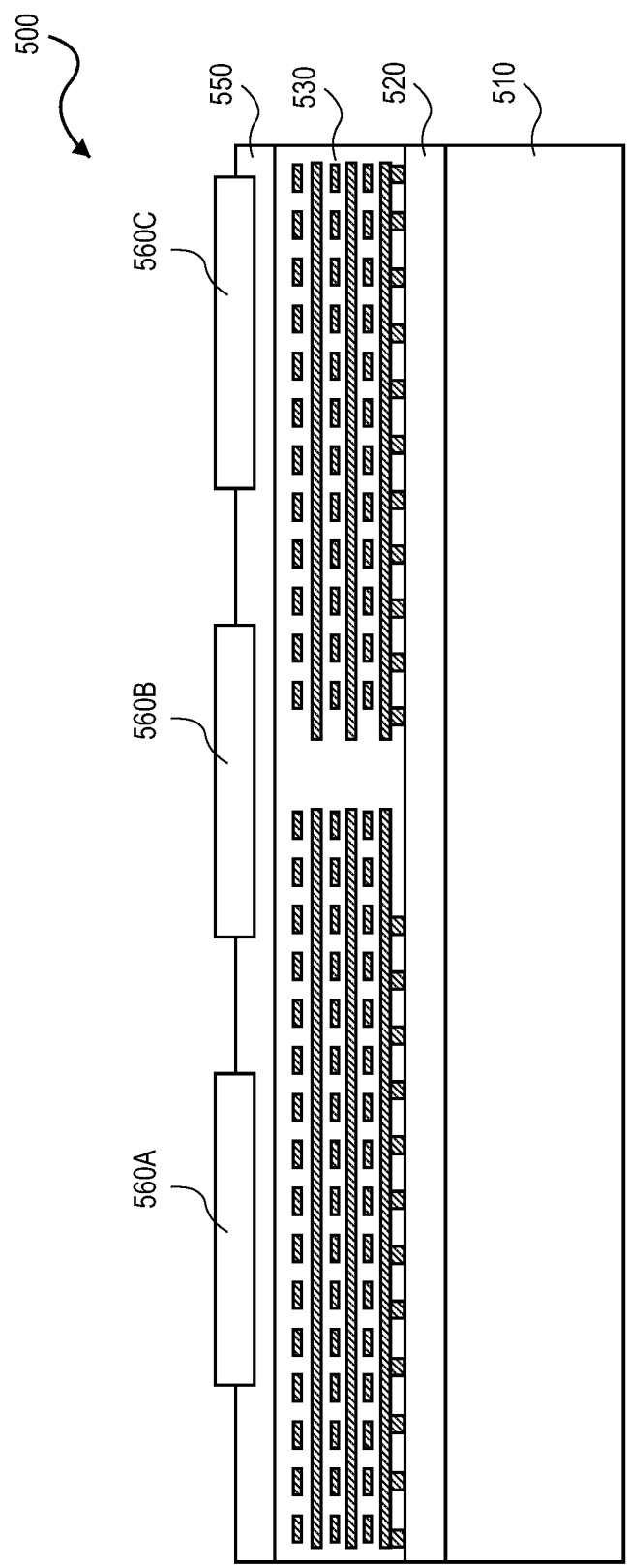
FIG. 11 shows the structure of FIG. 10 following the forming of a number of second integrated circuit device in the second device layer.

FIG. 11 shows the structure of FIG. 10 following the formation of devices in device layer 550. In one embodiment, devices formed in device layer 550 include device having a higher voltage range and having greater pitch than devices in device layer 520. FIG. 11 representatively shows device 560A that is, for example, a GaN device for high power application and device 560B and device 560C that are, for example, older generation p-type and n-type devices, respectively. Such devices may be formed as known in the art.

Figure 12:
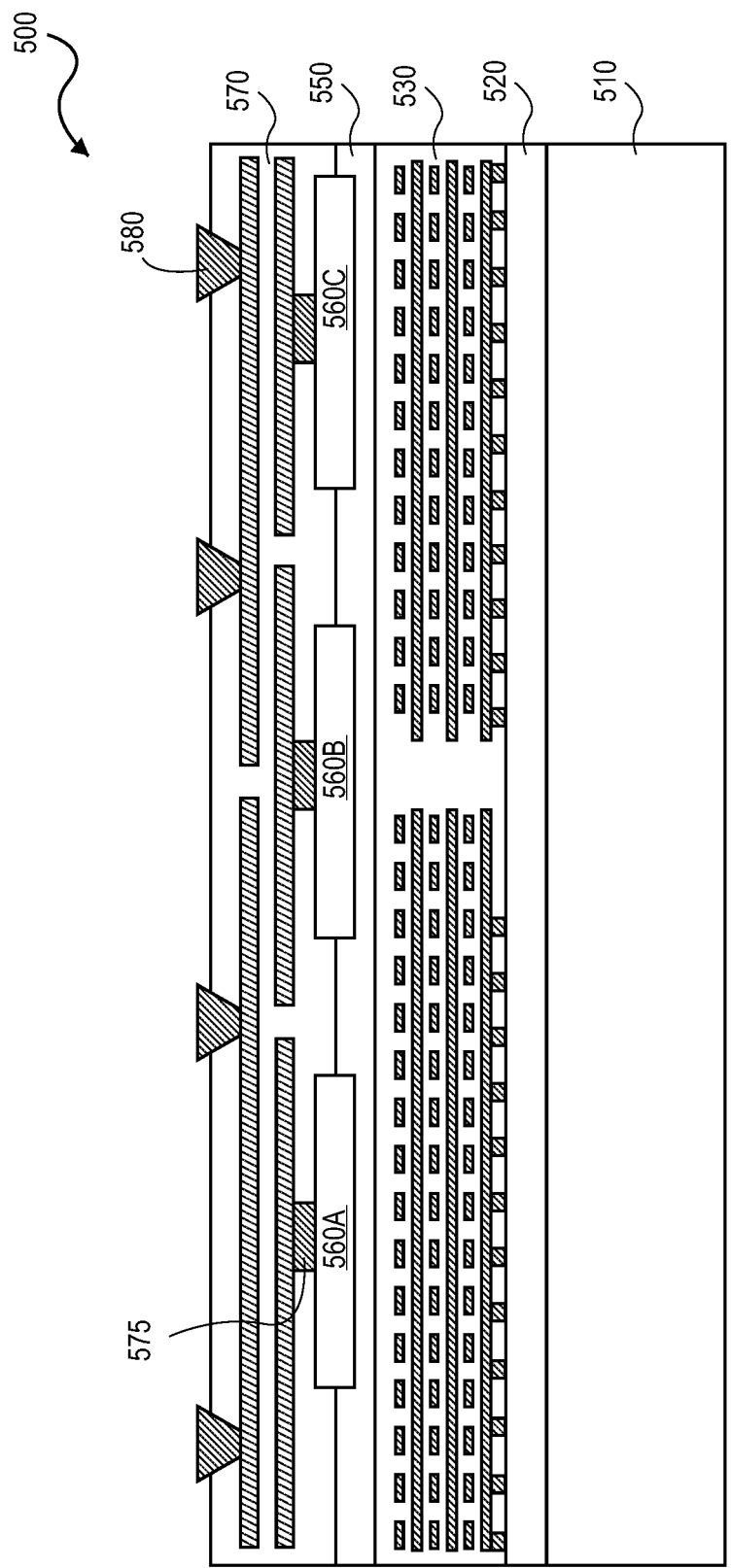
FIG. 12 shows the structure of FIG. 11 following the forming of a second plurality of interconnects juxtaposed to and connected to ones of the second integrated circuit devices and after forming of contact points on a side of the structure and connected to ones of the second plurality of interconnects.

FIG. 12 shows the structure of FIG. 11 following the introduction of plurality of interconnects 570 juxtaposed to device layer 550. In one embodiment, plurality of interconnects 570 are selected to be compatible with devices 560A, 560B and 560C (e.g., high voltage range devices). Accordingly, the dimensions of plurality of interconnects 570 are selected for its compatibility (e.g., impedance matching). FIG. 12 shows ones of plurality of interconnects 570 connected to devices in device layer 550 through contacts 575 that may be tungsten or copper. Plurality of interconnects 570 representatively are a copper material formed by, for example, a plating process. Plurality of interconnects 570 are insulated from one another by interlayer dielectric material such as an oxide. A layer of dielectric material is also disposed on an ultimate one of plurality of interconnects 570 (as viewed).

FIG. 12 also shows contacts 580 formed to one of plurality of interconnects 570. Such contacts 580 may be used to connect structure 500 to another structure, such as a package substrate. Such contacts are illustrated connected directly to ones of plurality of interconnects 570. It is appreciated that such contacts may be formed to a metallization layer that is connected to ones of plurality of interconnects 570.

In the above embodiment, a device layer was transferred to a structure devoid of devices. In another embodiment, devices such as device 560A, device 560B and device 560C may be formed on a sacrificial substrate and transferred after such formation. In another embodiment, some of device 560A, device 560B and device 560C may be formed prior to transfer and others formed after transfer.

Figure 13:
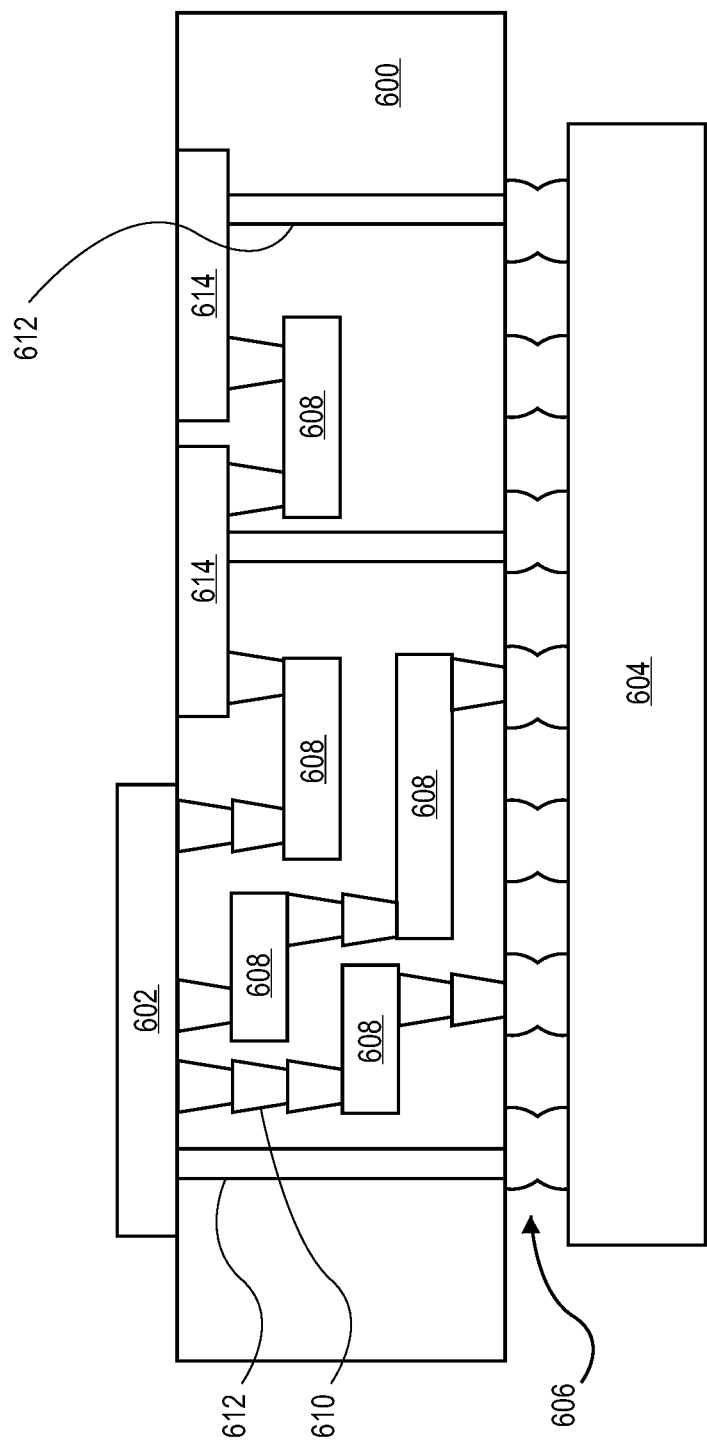
FIG. 13 is an interposer implementing one or more embodiments.

FIG. 13 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the invention, apparatuses or processes disclosed herein may be used in the fabrication of interposer 600.

Figure 14:
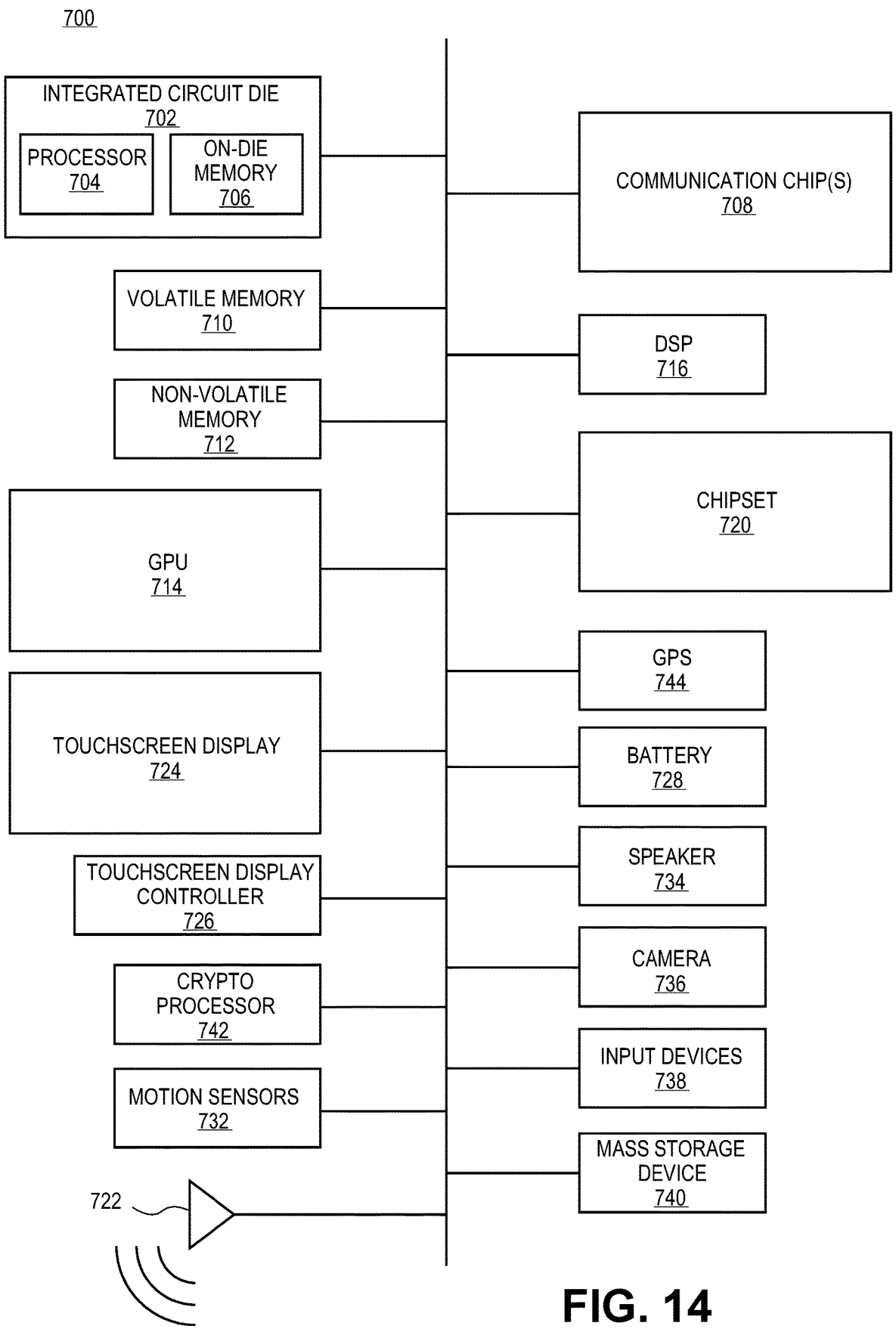
FIG. 14 illustrates an embodiment of a computing device.

FIG. 14 illustrates a computing device 700 in accordance with one embodiment of the invention. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a global positioning system (GPS) device 744, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The processor 704 of the computing device 700, in one embodiment, is a monolithic 3D IC including multiple device layers, that is formed in accordance with embodiments described above. The term "processor" may refer to any device or portion of a device that processes electronic data from registers and/or memory to transform that electronic data into other electronic data that may be stored in registers and/or memory.

The communication chip 708 may also include, in one embodiment, a monolithic 3D IC including multiple device layers, that is formed in accordance with embodiments described above.

In further embodiments, another component housed within the computing device 700 may contain a monolithic 3D IC including multiple device layers in accordance with implementations described above.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

Example 1 is a method including forming a plurality of first devices on a substrate; forming a plurality of first interconnects on the substrate wherein ones of the plurality of first interconnects are coupled to ones of the plurality of first devices; coupling one of a device layer devoid of a plurality of second devices and a device layer including a plurality of second devices to ones of the plurality of first interconnects, with the proviso that where a device layer devoid of the plurality of second devices is coupled, the method includes forming a plurality of second devices on the device layer thereafter; forming a plurality of second interconnects on the second device layer wherein ones of the plurality of second interconnects are coupled to ones of the plurality of second devices; and forming contacts points to one of ones of the first plurality of interconnects and ones of the second plurality of interconnects, the contact points operable for connection to an external source.

In Example 2, one of the plurality of first devices and the plurality of second devices of Example 1 include devices having a higher voltage range than the other of the plurality of first devices and the plurality of second devices.

In Example 3, the substrate of Example 1 includes a sacrificial substrate, the method further including coupling the sacrificial substrate to a carrier substrate; and removing the sacrificial substrate.

In Example 4, the plurality of the second devices of Example 3 include devices disposed at a finer pitch than a pitch of the plurality of first devices and coupling the sacrificial substrate to the carrier substrate includes disposing the plurality of second interconnects between the device layer and the carrier substrate.

In Example 5, the contact points of Example 4 are coupled to ones of the plurality of second interconnects.

In Example 6, forming a plurality of second interconnects of Example 1 includes forming an interconnect stack comprising the plurality of second interconnects and a plurality of memory devices.

In Example 7, the plurality of first devices of Example 1 includes devices disposed at a finer pitch than a pitch of the plurality of first devices and ones of the plurality of second devices have a higher voltage range than the plurality of second devices.

In Example 8, forming a plurality of second devices of Example 7 includes coupling the second devices to at least one of the first plurality of interconnects.

In Example 9, coupling a device layer to the first plurality of first interconnects on the substrate of Example 7 includes forming the plurality of second devices in a device layer on a second substrate and, after coupling the device layer to the first plurality of interconnects, the method includes thinning the second substrate.

In Example 10, the contact points of Example 7 are coupled to ones of the second plurality of interconnects.

Example 11 is a three-dimensional integrated circuit formed by any of the methods of Examples 1-10.

Example 12 is an apparatus including a first device layer including a plurality of first circuit devices disposed between a plurality of first interconnects and a plurality of second interconnects on a substrate wherein ones of the plurality of first interconnects and ones of the plurality of second interconnects are coupled to ones of the plurality of first circuit devices; a second device layer comprising a plurality of second devices juxtaposed and coupled to one of the plurality of first interconnects and the plurality of second interconnects; and contacts points coupled to one of ones of the first plurality of interconnects and ones of the second plurality of interconnects, the contact points operable for connection to an external source, wherein one of the plurality of first devices and the plurality of second devices include devices having a higher voltage range than the other of the plurality of first devices and the plurality of second devices.

In Example 13, the plurality of the first circuit devices of the first device layer of Example 12 include devices disposed at a finer pitch than a pitch of the plurality of second circuit devices and the plurality of first interconnects are disposed between a carrier substrate and the first device layer.

In Example 14, the contact points of Example 13 are coupled to ones of the plurality of second interconnects.

In Example 15, a plurality of memory devices of Example 12 are disposed within one of the plurality of first interconnects and the plurality of second interconnects.

In Example 16, the contact points of Example 12 include circuit contact points, the apparatus further comprising a package comprising package contact points coupled to the circuit contact points.

Example 17 is a method including forming a first device layer comprising a plurality of first circuit devices; forming a plurality of first interconnects wherein ones of the plurality of first interconnects are coupled to ones of the plurality of first devices; juxtaposing one of a second device layer devoid of a plurality of second devices and a device layer including a plurality of second devices to ones of the plurality of first interconnects, with the proviso that where a device layer devoid of the plurality of second devices is coupled, the method includes forming a plurality of second devices; forming a plurality of second interconnects on the second device layer wherein ones of the plurality of second interconnects are coupled to ones of the plurality of second devices; and juxtaposing contacts points to one of ones of the first plurality of interconnects and ones of the second plurality of interconnects, the contact points operable for connection to an external source, wherein one of the plurality of first devices and the plurality of second devices include devices having a higher voltage range than the other of the plurality of first devices and the plurality of second devices.

In Example 18, the first device layer of Example 17 is formed on a sacrificial substrate, the method further including coupling the sacrificial substrate to a carrier substrate; and removing the sacrificial substrate.

In Example 19, the plurality of the second devices of Example 18 include devices disposed at a finer pitch than a pitch of the plurality of first devices and coupling the sacrificial substrate to the carrier substrate includes disposing the plurality of second interconnects between the device layer and the carrier substrate.

In Example 20, the contact points of Example 19 are juxtaposed to ones of the plurality of second interconnects.

In Example 21, forming a plurality of second interconnects of Example 17 includes forming an interconnect stack comprising the plurality of second interconnects and a plurality of memory devices.

In Example 22, juxtaposing a second device layer to the first plurality of first interconnects of Example 17 includes forming the plurality of second devices in a device layer on a substrate and, after coupling the juxtaposing the second device layer to the first plurality of interconnects, the method includes thinning the second substrate.

In Example 23, the contact points of Example 17 are coupled to ones of the second plurality of interconnects.

Example 24 is a three-dimensional integrated circuit made by any of the methods of Examples 17-23.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   forming a plurality of first devices on a substrate;
   forming a plurality of first interconnects on the substrate wherein ones of the plurality of first interconnects are coupled to ones of the plurality of first devices;
   coupling a second substrate to ones of the plurality of first interconnects;
   subsequent to coupling the second substrate to the ones of the plurality of first interconnects coupled to the ones of the plurality of first devices, forming a plurality of second devices on the second substrate to form a second device layer, wherein the second device layer is electrically coupled to ones of the plurality of first interconnects;

forming a plurality of second interconnects on the second device layer wherein ones of the plurality of second interconnects are coupled to ones of the plurality of second devices; and forming contact points to ones of the plurality of first interconnects, the contact points operable for connection to an external source.

2. The method of claim 1, wherein one of the plurality of first devices and the plurality of second devices comprise devices having a higher voltage range than the other of the plurality of first devices and the plurality of second devices.

3. The method of claim 1, wherein the substrate comprises a sacrificial substrate, the method further comprising:
coupling the sacrificial substrate to a carrier substrate; and
removing the sacrificial substrate.

4. The method of claim 3, wherein the plurality of the second devices comprise devices disposed at a finer pitch than a pitch of the plurality of first devices and coupling the sacrificial substrate to the carrier substrate comprises disposing the plurality of second interconnects between the device layer and the carrier substrate.

5. The method of claim 1, wherein forming a plurality of second interconnects comprises forming an interconnect stack comprising the plurality of second interconnects and a plurality of memory devices.

6. The method of claim 1, wherein one of the plurality of first devices comprise devices and the plurality of second devices are disposed at a finer pitch than a pitch of the other plurality of first devices and the plurality of second devices and one of the plurality of first devices and the plurality of second devices comprise devices having a higher voltage range than the other of the plurality of first devices and the plurality of second devices.

7. The method of claim 6, wherein forming a plurality of second devices comprises coupling the second devices to at least one of the plurality of first interconnects.

8. The method of claim 6, wherein coupling a device layer to ones of the plurality of first interconnects on the substrate comprises forming the plurality of second devices in a device layer on a second substrate and, after coupling the device layer to ones of the plurality of first interconnects, the method comprises thinning the second substrate.

9. A method comprising:
forming a first device layer comprising a plurality of first devices;
forming a plurality of first interconnects wherein ones of the plurality of first interconnects are coupled to ones of the plurality of first devices;
juxtaposing a second substrate to ones of the plurality of first interconnects;
subsequent to juxtaposing the second substrate to the ones of the plurality of first interconnects coupled to the ones of the plurality of first devices, forming a plurality of second devices on the second substrate to form a second device layer, wherein the second device layer is electrically coupled to ones of the plurality of first interconnects;
forming a plurality of second interconnects on the second device layer wherein ones of the plurality of second interconnects are coupled to ones of the plurality of second devices; and
juxtaposing contact points to ones of the plurality of first interconnects, the contact points operable for connection to an external source,
wherein one of the plurality of first devices and the plurality of second devices comprise devices having a higher voltage range than the other of the plurality of first devices and the plurality of second devices.

10. The method of claim 9, wherein the first device layer is formed on a sacrificial substrate, the method further comprising:
coupling the sacrificial substrate to a carrier substrate; and
removing the sacrificial substrate.

11. The method of claim 10, wherein the plurality of the second devices comprise devices disposed at a finer pitch than a pitch of the plurality of first devices and coupling the sacrificial substrate to the carrier substrate comprises disposing the plurality of second interconnects between the device layer and the carrier substrate.

12. The method of claim 9, wherein forming a plurality of second interconnects comprises forming an interconnect stack comprising the plurality of second interconnects and a plurality of memory devices.

13. The method of claim 9, wherein juxtaposing a second device layer to ones of the plurality of first interconnects comprises forming the plurality of second devices in a device layer on a substrate and, after juxtaposing the second device layer to ones of the plurality of first interconnects, the method comprises thinning the second substrate.

* * * * *